(12) United States Patent
Odedara et al.

(10) Patent No.: US 9,148,157 B2
(45) Date of Patent: Sep. 29, 2015

(54) AUTO-PHASE SYNCHRONIZATION IN DELAY LOCKED LOOPS

(71) Applicant: SanDisk Technologies Inc., Plano, TX (US)

(72) Inventors: Bhavin Odedara, Bangalore (IN); Deepak Pancholi, Bangalore (IN); Vishal Rustagi, Bangalore (IN)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/461,921

(22) Filed: Aug. 18, 2014

(65) Prior Publication Data

US 2015/0214965 A1 Jul. 30, 2015

(30) Foreign Application Priority Data

Jan. 30, 2014 (IN) .............................. 427/CHE/2014

(51) Int. Cl.
*H03L 7/06* (2006.01)
*H03L 7/087* (2006.01)

(52) U.S. Cl.
CPC ...................................... *H03L 7/087* (2013.01)

(58) Field of Classification Search
USPC .................................. 327/147–149, 156–158
See application file for complete search history.

(56) References Cited

U.S. PATENT DOCUMENTS

| 6,388,485 | B2 | 5/2002 | Kim | |
|---|---|---|---|---|
| 6,496,048 | B1 * | 12/2002 | Sikkink | 327/277 |
| 6,741,522 | B1 * | 5/2004 | Lin | 368/118 |
| 7,061,224 | B2 * | 6/2006 | Kakizawa et al. | 324/76.54 |
| 7,161,402 | B1 * | 1/2007 | Sompur et al. | 327/158 |
| 7,388,795 | B1 * | 6/2008 | To et al. | 365/194 |
| 7,911,873 | B1 * | 3/2011 | Menon et al. | 365/233.13 |
| 8,890,591 | B1 * | 11/2014 | Xiu | 327/156 |
| 2005/0286320 | A1 | 12/2005 | Iwasaki | |
| 2006/0055441 | A1 * | 3/2006 | McClannahan et al. | 327/158 |
| 2007/0096787 | A1 * | 5/2007 | Heightley | 327/276 |
| 2008/0036515 | A1 | 2/2008 | Asano | |
| 2009/0085623 | A1 | 4/2009 | Schneider et al. | |
| 2010/0156459 | A1 * | 6/2010 | Plants et al. | 326/39 |
| 2012/0194238 | A1 * | 8/2012 | Maneatis et al. | 327/157 |
| 2013/0342251 | A1 * | 12/2013 | Patel et al. | 327/158 |
| 2014/0312945 | A1 * | 10/2014 | Ippili et al. | 327/157 |
| 2015/0003176 | A1 * | 1/2015 | Spinks | 365/194 |

OTHER PUBLICATIONS

International Search Report and Written Opinion for corresponding International Application No. PCT/US2015/013273 mailed Apr. 10, 2015.

* cited by examiner

*Primary Examiner* — Adam Houston
(74) *Attorney, Agent, or Firm* — Brinks Gilson & Lione

(57) ABSTRACT

Tuning circuitry may include a controller that is configured to determine a phase difference for a pair of signals generated at different points in a master delay line of a master-slave delay locked loop (DLL) circuit. One of signals of the pair may be communicated through a slave delay line of the master-slave DLL circuit before the phase difference is determined. A programming delay value used to set a phase delay of the slave delay line may be adjusted or tuned based on the phase difference.

20 Claims, 5 Drawing Sheets

AUTO-PHASE SYNCHRONIZATION IN DELAY LOCKED LOOPS

CROSS-REFERENCE TO RELATED APPLICATIONS

This application claims priority to Indian Patent Application No. 427/CHE/2014, filed Jan. 30, 2014. The contents of Indian Patent Application No. 427/CHE/2014 are incorporated by reference in their entirety.

BACKGROUND

Master-slave delay locked loop (DLL) circuits may include a slave delay line that is configured to delay an input signal by a desired phase delay. As the architecture for master-slave DLL circuits moves toward lower geometries, phase delays associated with different slave delay lines, including those in different dies, may vary significantly. Accordingly, some slave delay lines may delay a received signal by an amount that is different than the desired phase delay. This difference or mismatch, referred to as static phase error, may reduce or limit performance, such as reducing timing margins to latch data.

SUMMARY

In a first aspect, a circuit may be configured to adjust a programming delay value used to set a phase delay of a slave delay line of a master-slave delay locked loop (DLL) circuit. The circuit may include a controller configured to determine a phase difference between a pair of master delay line signals generated at different points of a master delay line of the master-slave DLL circuit. One of the master delay line signals of the pair is communicated through the slave delay line before the phase difference is determined. In addition, the controller may be configured to adjust a programming delay value based on the phase difference to generate an adjusted programming delay value; and output the adjusted programming delay value to a bias generator that generates an output bias based on the adjusted programming delay value and supplies the output bias to the slave delay line to set a phase delay of the slave delay line.

In a second aspect, a method of adjusting an initial programming delay value used to set a phase delay of a slave delay line of a master-slave delay locked loop (DLL) circuit may include: communicating a first master delay line signal of a pair of master delay line signals through the slave delay line to generate a delayed first master delay line signal; receiving, with a controller, the delayed first master delay line signal from an output of the slave delay line and a second master delay line signal of the pair; determining, with the controller, a phase difference between the delayed first master delay line signal and a second master delay line signal of the pair; generating, with the controller, an adjusted programming delay value that is adjusted from the initial programming delay value based on the phase difference; and outputting, with the controller, the adjusted programming delay value to a bias generator that generates an output bias based on the adjusted programming delay value and supplies the output bias to the slave delay line to set a phase delay of the slave delay line.

In a third aspect, a system may include a master-slave delay locked loop (DLL) circuit comprising: a master delay line; a slave delay line; and a bias generator configured to supply an output bias to the slave delay line to set a phase delay of the slave delay line. The system may also include a tuning circuit configured to: receive a pair of master delay line signals from different points of the master delay line; output a first master delay line signal of the pair to the slave delay line; receive a delayed first master delay line signal from the slave delay line; generate a programming delay value based on a phase difference between the delayed first master delay line signal and a second master delay line signal of the pair; and output the programming delay value to the bias generator. The bias generator may be configured to set a level of the output bias based on the programming delay value received from the tuning circuit.

In sum, a tuning circuit may be configured to adjust and/or tune a programming delay value used to generate an output bias for a slave delay line of a master-slave delay locked loop circuit so that a static phase error of an output of the slave delay line may be reduced and/or minimized. Also, costly and/or time extensive efforts to reduce the static phase error, such as post-silicon trimming, may be avoided or minimized.

These and other embodiments, features, aspects and advantages of the present description will become better understood from the description herein, appended claims, and accompanying drawings.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Various modifications to and equivalents of the embodiments described and shown are possible and various generic principles defined herein may be applied to these and other embodiments. Thus, the claimed invention is to be accorded the widest scope consistent with the principles, features, and teachings disclosed herein.

The present disclosure describes a programming delay tuning circuit and related systems and methods for a master-slave delay locked loop (DLL) circuit. The tuning circuit may be configured to tune an initial programming delay value that may be used to set a phase delay of a slave delay line of the master-slave DLL circuit. The tuned programming delay value may yield an actual phase delay of the slave delay line that is closer to a desired phase delay than the phase delay that would otherwise result if the initial programming delay value is used to set the phase delay.

Statistical processing of master delay line signals of a master delay line of the master-slave DLL circuit may be used to generate the tuned programming delay value. In particular, different master delay line signals with different phases may be taken at different points along the master delay line and sent through the slave delay line to generate delayed versions of the different master delay line signals. These delayed master delay line signals may be compared with other master delay line signals having corresponding phase delays. Differences in phase delays of the master delay line signals determined from the comparisons may be averaged, and the average of the differences may be used to tune the initial programming delay value.

Figure 1:
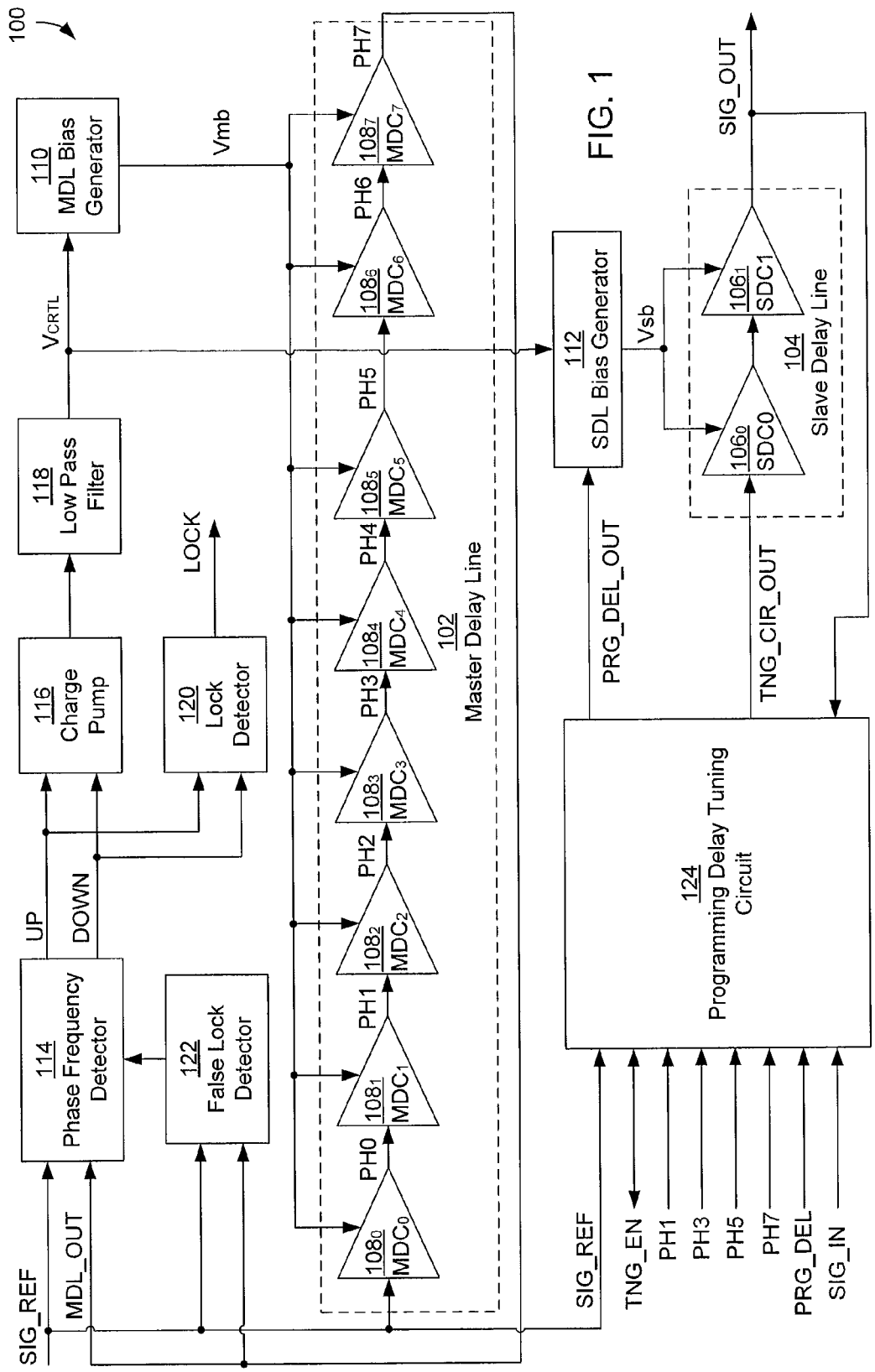
FIG. 1 is a block diagram of an example system that includes a master-slave delay locked loop circuit and a tuning circuit that tunes programming delay values for a slave delay line.

FIG. 1 shows a system 100 that includes an example master-slave delay locked loop (DLL) circuit having a master delay line 102 and a slave delay line 104. The slave delay line 104 may be configured to generate and output an output signal SIG_OUT having a phase that is delayed or offset relative to a phase of an input signal SIG_IN. The slave delay line 104 may be configured to generate the output signal SIG_OUT to have a phase delay that matches a predetermined and/or desired phase delay. To do so, the slave delay line 104 may include an N-number of one or more slave delay cells (SDC) $106_0$ to $106_{N-1}$. The example master-slave DLL circuit shown in FIG. 1 has two slave delay cells $106_0$ and $106_1$, although numbers of one or more slave delay cells other than two may be used. Each of the slave delay cells $106_0$ and $106_1$ may have an associated phase delay. A sum of the associated phase delays may equal a phase delay of the output signal SIG_OUT. In addition, the slave delay cells $106_0$ and $106_1$ may be configured to have the same phase delay. To illustrate, if the desired phase delay is 90 degrees, then the delay cells $106_0$ and $106_1$ may each be configured to have an associated phase delay of 45 degrees. As alternative example illustrations, for a slave delay line 104 having only a single slave delay cell, the single slave delay cell may be configured to have an associated phase delay of 90 degrees; for a slave delay line 104 having three slave delay cells, each of the three slave delay cells may be configured to have an associated phase delay of 30 degrees; for a slave delay line 104 having four slave delay cells, each of the four slave delay cells may be configured to have an associated phase delay of 22.5 degrees, and so on.

The master delay line 102 may be configured to generate a master delay line output signal MDL_OUT that is one full period or 360 degrees out of phase from an input or reference signal SIG_REF that is input into the master delay line 102. An example reference signal may be a reference clock signal or other similar type of signal having a square waveform with a duty cycle of about fifty percent. To generate the master delay line output signal MDL_OUT, the master delay line 102 may include a M-number of master delay cells (MDC) $108_0$ to $108_{M-1}$, where M is two or greater. The example master-slave DLL circuit shown in FIG. 1 has eight master delay cells $108_0$ to $108_7$, although numbers of two or more master delay cells other than eight may be used. Like the slave delay cells $106_0$ and $106_1$, each of the master delay cells $108_0$ to $108_7$ may have an associated phase delay. For the master delay line 102, a sum of the associated phase delays may equal a phase delay of 360 degrees relative to the reference signal SIG_REF. In addition, the master delay cells $108_0$ to $108_7$ may be configured to have the same phase delay. Accordingly, each of the eight master delay cells $108_0$ to $108_7$ may be configured to have a phase delay of 45 degrees. For alternative example configurations having a number of master delay cells other than eight, the master delay cells may be configured to have proportionate phase delays so that the total phase delay of the master delay line is 360 degrees. As example illustrations, for a master delay line 102 having three master delay cells, each of the three master delay cells may have associated phase delays of 120 degrees; for a master delay line 102 having four master delay cells, each of the four master delay cells may have associated phase delays of 90 degrees; for a master delay line 102 having twelve master delay cells, each of the twelve master delay cells have an associated phase delay of 30 degrees, and so on.

For some example configurations, in addition to the master delay cells $108_0$ to $108_7$ being configured to have the same associated phase delay and the slave delay cells $106_0$ to $106_1$ being configured to have the same associated phase delay, the master delay cells $108_0$ to $108_7$ and the slave delay cells $106_0$ to $106_1$ may be configured to have the same delay among each other. Accordingly, the ratio of the M-number of master delay cells $108_0$ to $108_{M-1}$ to the N-number of slave delay cells $106_0$ to $106_{N-1}$ may be equal to the ratio of one full period of phase delay (i.e., 360 degrees) to the desired phase delay of the output signal SIG_OUT that is output from the slave delay line 104. For the example master-slave DLL shown in FIG. 1, the desired phase delay of the output signal SIG_OUT is 90 degrees, since the master delay line 102 includes eight master delay cells $108_0$ to $108_7$ and the slave delay line 104 includes two slave delay cells $106_0$ and $106_1$.

In addition, the master delay cells $108_0$ to $108_7$ and the slave delay cells $106_0$ and $106_1$ may each be configured as variable delay cells in which their respective phase delays may be adjusted or varied by adjusting or varying an amount of current being drawn through the delay cells and/or an amount of voltage being applied to delay cells. Example variable delay cells may include variable delay inverters, such as current control inverters or differential amplifiers, as examples.

For the example master-slave DLL circuit shown in FIG. 1, a control voltage $V_{CTRL}$ may be generated and applied to a MDL bias generator 110 and a SDL bias generator 112. In response to the control voltage $V_{CTRL}$, the MDL bias generator 110 may generate one or more master output biases, such as one or more master bias voltages $V_{mb}$, which may be applied to the master delay cells $108_0$ to $108_7$, such as to gate terminals of transistors making up the master delay cells $108_0$ to $108_7$. Similarly, in response to the control voltage $V_{CTRL}$, the SDL bias generator 110 may generate one or more output biases, such as one or more slave bias voltage $V_{sb}$, which may be applied to the slave delay cells $106_0$ and $106_1$, such as to gate terminal of transistors making up the slave delay cells $106_0$ and $106_1$. In response to receipt of their respective master and slave bias voltages $V_{mb}$, $V_{sb}$, the master and slave delay cells $108_0$ to $108_7$, $106_0$ and $106_1$ may each draw a respective current, which in turn may determine an amount of phase delay produced by each delay cell. The voltage levels of the master and slave bias voltages $V_{mb}$, $V_{sb}$ may determine the amount of current that is drawn, which in turn may determine the amount of phase delay produced by the delay cells. Accordingly, in order to vary the phase delay produced by each of the master and slave delay cells $108_0$ to $108_7$, $106_0$ and $106_1$, the control voltage $V_{CTRL}$ may be varied, which may vary the master and slave bias voltage $V_{mb}$, $V_{sb}$, which in turn may vary the current drawn through the respective master and slave delay cells $108_0$ to $108_7$, $106_0$ and $106_1$. Depending on the configuration of the transistors, the one or more master bias voltages $V_{mb}$ and/or the one or more slave bias voltage $V_{sb}$ may include a single voltage or a plurality of voltages applied to different types of transistors, such as a pair of voltages where one is applied to n-type metal-oxide-semiconductor field effect transistors (NMOS transistors) and another is applied to p-type metal-oxide-semiconductor field effect transistors (PMOS transistors). Additionally, the MDL and SDL bias generators 110, 112 may have various circuit configurations. In one example, the MDL and SDL bias generators 110, 112 may have voltage-to-current (V/I) converters that generate respective currents based at least in part on the control voltage $V_{CRTL}$ being received. The MDL and SDL bias generators 110, 112 may each further include current mirror circuitry, which may mirror the current being generated by the respective V/I converters to generate the master and slave bias voltages $V_{mb}$, $V_{sb}$. Other circuit configurations or topologies to generate the master and slave bias voltage $V_{mb}$, $V_{sb}$ based on the control voltage $V_{CTRL}$, may be possible.

The example master-slave DLL circuit shown in FIG. 1 may include locking circuitry that is configured to set the control voltage $V_{CTRL}$ so that the output signal MDL_OUT of the master delay line 102 is 360-degrees out of phase from the input signal to the master delay line 102, which is the reference signal SIG_REF. The locking circuitry may include a phase frequency detector 114, a charge pump 116, a lower pass filter 118, a lock detector 120, and a false lock detector 122.

The phase frequency detector 114 (which may also be referred to as a phase detector) to generate UP and DOWN signals to the charge pump 116. The UP and DOWN signals may be generated based on a time difference between edges, such as rising edges, of the reference signal SIG_REF and the output signal MDL_OUT. The UP and DOWN signals may indicate to the charge pump 116 which of the edges arrives first. In particular, if an edge of the reference signal SIG_REF arrives before an edge of the output signal MDL_OUT, then the phase frequency detector 114 may output the UP signal (or the UP signal may be output at a logic high level while the DOWN signal may be output at a logic low level). Alternatively, if an edge of the output signal MDL_OUT arrives at the same time or before an edge of the reference signal SIG_REF, then the phase frequency detector 114 may output the DOWN signal (or the DOWN signal may be output at a logic high level while the UP signal may be output at a logic low level).

The low pass filter 118 may include a capacitor or other similar energy storing circuitry that is configured to generate the control voltage $V_{CTRL}$, which may be applied to the MDL and SDL bias generators 110, 112. The charge pump 116 may include current source and sink circuitry or other similar circuitry that is configured to source current to and sink away current from the low pass filter 118 to set (e.g., pull up and pull down) the voltage level of the control voltage $V_{CTRL}$. The sourcing and sinking of current performed by the charge pump 116 may depend on the UP and DOWN signals provided by the phase frequency detector 114.

As shown in FIG. 1, the phase frequency detector 114 may also output the UP and DOWN signals to a lock detector 120, which may be configured to detect when the master delay line 102 is stably outputting the output signal MDL_OUT with a phase delay that is 360 degrees out of phase from the reference signal SIG_REF. When the master delay line 102 is stably outputting the output signal MDL_OUT with the 360-degree phase delay, then the lock detector 120 may output a lock signal LOCK, which may indicate that the phase delay of the output signal MDL_OUT has settled and/or is locked.

In addition, the false lock detector 122 may receive the reference signal SIG_REF and the output signal MDL_OUT, may be configured to determine when the output signal MDL_OUT is not delayed 360-degrees from the reference signal SIG_REF even though the reference signal SIG_REF and the output signal MDL_OUT are aligned. For example, the output signal MDL_OUT may be two full periods (i.e., 720 degrees) or three full periods (i.e., 1080 degrees) out of phase from the reference signal SIG_REF. The false lock detector 122 may be configured to detect these situations and communicate them to the phase frequency detector 114 so that the lock detector 120 does not improperly output the lock signal LOCK when the reference signal SIG_REF and the output signal MDL_OUT are aligned but not only one period out of phase from each other.

In actuality, when the phase delay of the output signal MDL_OUT is locked, the sum total of the phase delays of the master delay cells $108_0$ to $108_7$ may be 360 degrees, but the individual master delay cells $108_0$ to $108_7$ may not all be the same and/or some if not all of the master delay cells $108_0$ to $108_7$ may not have the intended or ideal phase delay of 45-degrees. For example, an actual phase delay of the master delay cells $108_0$ to $108_7$ may be plus-or-minus some associated value δ from the intended or ideal phase delay of 45-degrees. This variation in phase delay may be due to various non-idealities or mismatches between the master delay cells $108_0$ to $108_7$ resulting from process, material (e.g., silicon), and/or manufacturing variations.

For similar reasons, the slave delay cells $106_0$ and $106_1$ may not have the same phase delay as each other. Additionally, because the locking circuitry is used to lock the phase delay for the output signal MDL_OUT of the master delay line 102 but not the output signal SIG_OUT of the slave delay line 104, when the phase delay of the output signal MDL_OUT is locked, the actual phase delay of the output signal SIG_OUT being output from the slave delay line 104 may be different than the desired phase delay. To illustrate, suppose that the desired phase delay for the output signal SIG_OUT is 90 degrees. Further, suppose that the locking circuitry locks the control voltage $V_{CTRL}$ at a voltage level that causes the SDL bias generator 112 to output the slave bias voltage $V_{sb}$ at a level that yields a phase delay of 50 degrees for the first slave delay cell $106_0$ and a phase delay of 55 degrees for the second slave delay cell $106_1$. Accordingly, the phase delay of the output signal SIG_OUT may be 105 degrees, or 15 degrees off target from the desired phase delay of 90 degrees. This difference or mismatch between the actual phase delay of the output signal SIG_OUT and the desired phase delay may be referred to as static phase error.

To compensate for the static phase error, the SDL bias generator 112 may be configured to receive digital control bits in addition to the control voltage $V_{CTRL}$ to generate the slave bias voltage $V_{sb}$. In particular, an initial programming delay value PRG_DEL may be used to adjust and/or tune the slave bias voltage $V_{sb}$. The programming delay value PRG_DEL may be a multi-bit value, which for some example configurations, may be a 7-bit value. Adjustment of one or more of the bits of the value may change the voltage level of the slave bias voltage $V_{sb}$. Accordingly, based on the desired phase delay, the actual phase delay, and/or the phase delay difference between the actual phase delay and the desired phase delay of the output signal SIG_OUT, a particular programming delay value PRG_DEL may be selected from among a plurality of programming delay values and used, along with the control voltage $V_{CTRL}$, to generate the slave bias voltage $V_{sb}$. Application of both the control voltage $V_{CTRL}$ and the selected programming delay value PRG_DEL rather than only the control voltage $V_{CTRL}$ may yield an actual phase delay of the output signal SIG_OUT that is closer to the desired phase delay.

The programming delay values PRG_DEL may be initial programming delay values, which may be determined through simulations or other activities prior to manufacture and/or operation of the system 100. However, due to the various manufacturing, process, and/or materials inconsistencies or variations, the programming delay values PRG_DEL may provide inconsistent phase delays and/or insufficient tuning of the slave bias voltage $V_{sb}$. For example, due to differences in silicon dies, the programming delay value PRG_DEL may differently tune different slave delay lines of different master-slave DLL circuits. As a result, an improvable amount of mismatch or static phase error between the actual phase delay and the desired phase delay of the output signal SIG_OUT may still result when the programming delay value PRG_DEL is output to the SDL bias generator 112.

The system 100 may further include a programming delay tuning circuit 124 that may be configured to perform "on-chip," "on-the-fly," and/or post-manufacturing tuning of the programming delay value PRG_DEL to generate a tuned programming delay value that may further reduce the static phase error. The tuned programming delay value may be the programming delay output value PRG_DEL_OUT applied to the SDL bias generator 112 instead of the initial programming delay value PRG_DEL, which may yield a phase delay for the output signal SIG_OUT that is closer to the desired phase delay than if the initial programming delay value PRG_DEL were instead directly applied to the SDL bias generator 112.

The programming delay tuning circuit 124 may be configured to tune or adjust the programming delay value PRG_DEL based on one or more comparisons of master delay line signals taken at different points in the master delay line 102. The master delay line signals may include the input signal to the master delay line 102 (i.e., the reference signal SIG_REF), the output signal of the master delay line 102 (i.e., the output signal MDL_OUT), and/or signals generated at the outputs of the master delay cells $108_0$ to $108_{M-1}$ of the master delay line 102.

The master delay line signals generated at the outputs of the master delay cells $108_0$ to $108_{M-1}$ of the master delay line 102 may include an M-number of ith master delay line signals PH(i–1) generated at the output of each of the ith master delay cells $108_0$ to $108_{M-1}$ and/or the input of each of the (i+1)th master delay cells $108_0$ to $108_{M-1}$, where i increases from 0 to M–1. In particular, for the master delay line 102 where M=8, the master delay line signals generated at the outputs of the master delay cells $108_0$ to $108_M$ of the master delay line 102 may include a first master delay line signal PH0 generated at the output of the first master delay cell $108_0$, a second master delay line signal PH1 generated at the output of the second master delay cell $108_1$, a third master delay line signal PH2 generated at the output of the third master delay cell $108_2$, a fourth master delay line signal PH3 generated at the output of the fourth master delay cell $108_3$, a fifth master delay line signal PH4 generated at the output of the fifth master delay cell $108_4$, a sixth master delay line signal PH5 generated at the output of the sixth master delay cell $108_5$, a seventh master delay line signal PH6 generated at the output of the seventh master delay cell $108_6$, and an eighth master delay line signal PH7 generated at the output of the eight master delay cell $108_7$. The eighth master delay line signal PH7 may also be the output signal MDL_OUT of the master delay line 102, as shown in FIG. 1.

Each ith master delay line signals PH(i–1) may have an intended phase delay relative to the reference signal SIG_REF. As previously described, when the master delay line 102 is locked, the master delay cells $108_0$ to $108_{M-1}$ may each have an intended phase delay of 45 degrees. Accordingly, for each ith master delay line signal PH(i–1), a respective intended phase delay relative to the phase of the reference signal SIG_REF may be the intended phase delay (e.g., 45 degrees) multiplied by the integer (i+1) corresponding to the ith master delay cell $108_i$ that is configured to output the ith master delay line signal PH(i–1). For the example where M=8 as shown in FIG. 1, the intended phase delay relative to the reference signal SIG_REF may be 45 degrees (45×1) for the first master delay line signal PH0, 90 degrees (45×2) for the second master delay line signal PH1, 135 degrees (45×3) for the third master delay line signal PH2, 180 degrees (45×4) for the fourth master delay line signal PH3, 225 degrees (45×5) for the fifth master delay line signal PH4, 270 degrees (45×6) for the sixth master delay line signal PH5, 315 degrees (45×7) for the seventh master delay line signal PH6, and 360 degrees (45×8) for the eighth master delay line signal PH7.

For each of the one or more comparisons performed by the programming delay tuning circuit 124, two (or a pair) of the plurality of master delay line signals may be selected. The programming delay tuning circuit 124 may output one of the selected master delay line signals as an output TNG_CIR_OUT to the slave delay line 104. The selected master delay line signal sent to the slave delay line 102 may be passed through the slave delay line 104 to generate a delayed master delay line signal, which may be output by the slave delay line 104 as the output signal SIG_OUT. The delayed master delay line signal may then be sent back to the programming delay tuning circuit 124, where it may be compared with the other of the selected master delay line signals to determine an actual phase difference between the delayed master delay line signal and the other selected master delay line signal. If more than one pair of master delay line signals are to be selected and compared, then the above process may be repeated until all of the pairs are selected and compared and actual phase differences are determined.

If only a single comparison is performed, then the actual phase difference determined from the comparison may be used to adjust or tune the programming delay value PRG_DEL to generate the tuned programming delay value. If multiple comparisons are performed, then a plurality of actual phase differences determined from the multiple comparisons may first be averaged, and the average of the plurality of actual phase differences may be used to adjust or tune the programming delay value PRG_DEL to generate the tuned programming delay value.

The selection of the master delay line signals may be made in accordance with a predetermined selection scheme that identifies pairs of master delay line signals to be selected and compared. In addition, for some examples, the predetermined selection scheme may also identify an order in which the identified pairs of master delay line signals are selected for comparison.

For some examples, the selection scheme may identify pairs of master delay line signals that have a difference in intended phase delay between each other that is the same as the desired phase delay of the output signal SIG_OUT. When the intended phase delay of the master delay cells $108_0$ to $108_{M-1}$ is the same as the intended phase delay of the slave delay cells $106_0$ to $106_{N-1}$, possible pairs may include master delay line signals that are an N-number of master delay cells apart from each other. As an example, for the master and slave delay lines 102, 104 shown in FIG. 1, where N=2, M=8, and the desired phase delay is 90 degrees, possible pairs of master delay line signals may include the reference signal SIG_REF and the second master delay line signal PH1, the first master delay line signal PH0 and the third master delay line signal PH2, the second master delay line signal PH1 and the fourth master delay line signal PH3, the third master delay line signal PH2 and the fifth master delay line signal PH4, the fourth master delay line signal PH3 and the sixth master delay line signal PH5, the fifth master delay line signal PH4 and the seventh master delay line signal PH6, and the sixth master delay line signal PH5 and the eight master delay line signal PH7.

Additionally, the selection scheme may identify all, less than all, or at least one of the possible pairs of master delay line signals that have phase delay differences equal to the desired phase delay. In one example that identifies less than all of the possible pairs, for a next pair of master delay line signals that is selected for comparison, one of the master delay line signals is common with the last, prior pair of master delay line signals selected for comparison. Using the example above with N=2, M=8, and the desired phase delay being 90 degrees, such pairs may include the reference signal SIG_REF and the second master delay line signal PH1, the second master delay line signal PH1 and the fourth master delay line signal PH3, the fourth master delay line signal PH3 and the sixth master delay line signal PH5, and the sixth master delay line signal PH5 and the eight master delay line signal PH7. This selection scheme is shown in FIG. 1 with the reference signal SIG_REF and the second, fourth, sixth, and eighth master delay line signals PH1, PH3, PH5, and PH7 as being input to the programming delay tuning circuit 124. Alternatively, such pairs may include the first master delay line signal PH0 and the third master delay line signal PH2, the third master delay line signal PH2 and the fifth master delay line signal PH4, and the fifth master delay line signal PH4 and the seventh master delay line signal PH6.

Further, the selection scheme may identify, for each pair, which master delay line signal of the pair is to be passed through the slave delay line 104 before being compared with the other master delay line signal of the pair. In one example scheme, the selection scheme may identify that the master delay line signal with the lower intended phase delay relative to the phase of the reference signal SIG_REF may be sent through the slave delay line 104. Alternatively, the master delay line signal with the higher intended phase delay may be selected. In addition or alternatively, for some example selection schemes, two comparisons may be performed for each selected pair—a first comparison where one of the pair of master delay line signals is passed through the slave delay line 104 and a second comparison where the other of the pair of master delay line signals is passed through the slave delay line 104.

In addition or alternatively, where the selection scheme includes one of the master delay line signals being common to the next and prior pairs, the common master delay line signal may be passed through the slave delay line 104 for one of the comparisons but not the other. For example, if the common master delay line signal was not passed through the slave delay line 104 for the last, prior comparison, then the common master delay line signal may be passed through the slave delay line 104 for the next comparison, or vice versa. Alternatively, the common master delay line may be the master delay line signal of the pair that is passed through the slave delay line 104 for both the last, prior comparison and the next comparison or that is not passed through the slave delay line 104 for both the last, prior comparison and the next comparison.

In addition or alternatively, some example selection schemes may separate or group the master delay line signals of each of the pairs into two groups of master delay line signals, with one of the groups including or identifying the master delay line signals to be passed through the slave delay line 104 and the other group including or identifying the master delay line signals compared with those included or identified in the first group.

Those master delay line signals that are identified under the selection scheme to be selected and compared may be communicated from the master delay line 102 to the programming delay tuning circuit 124. In the example configuration shown in FIG. 1, the master delay line signals identified under the selection scheme for selection and comparison are the reference signal SIG_REF, the second master delay line signal PH1, the fourth master delay line signal PH3, the sixth master delay line signal PH5, and the eighth master delay line signal PH7.

Figure 2:
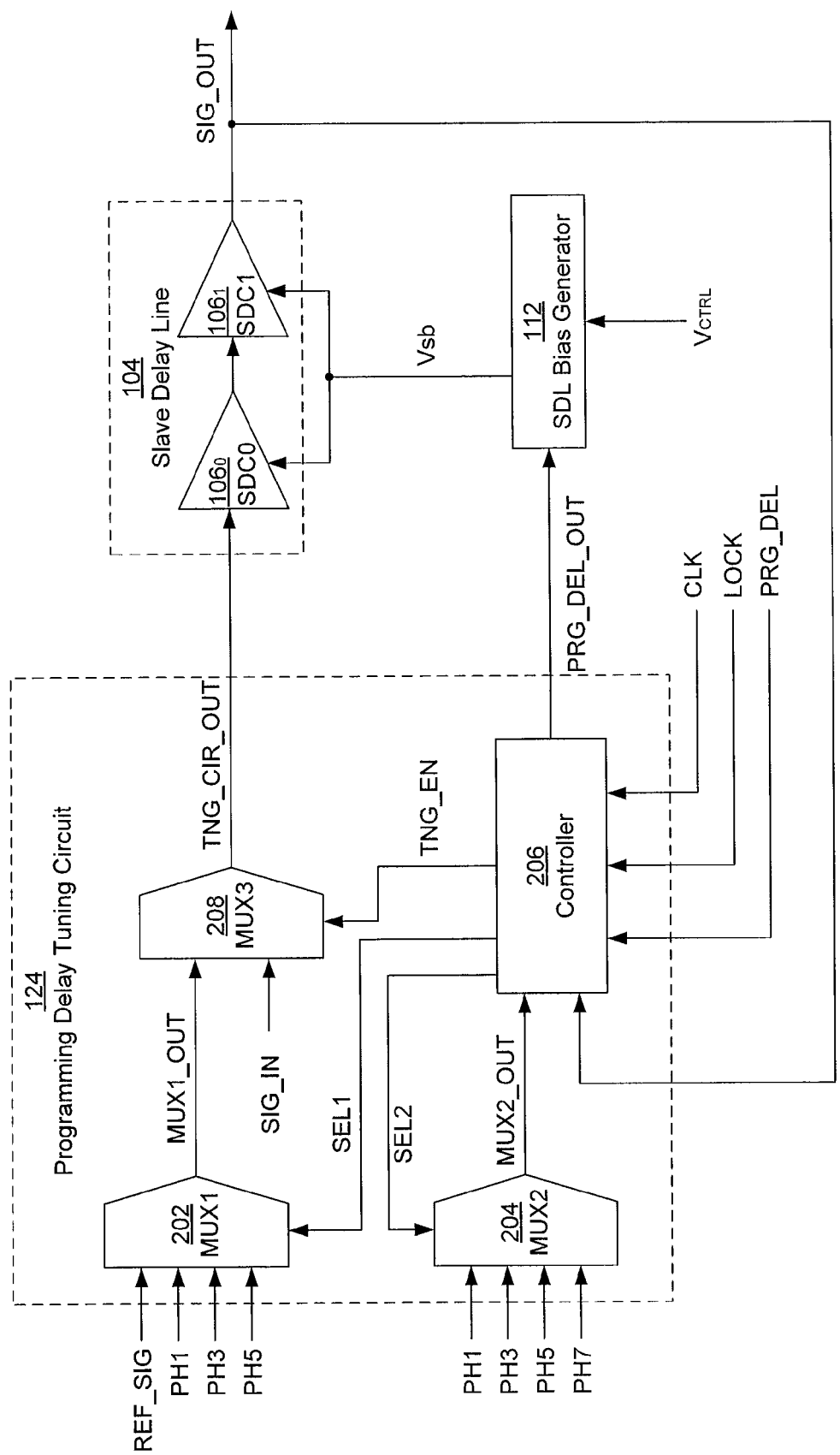
FIG. 2 is a block diagram of an example circuit implementation of the tuning circuit in communication with a slave delay line and a bias generator for the slave delay line.

FIG. 2 shows a block diagram of an example configuration of the programming delay tuning circuit 124 in communication with the slave delay line 104 and the SDL bias generator 112. The programming delay tuning circuit 124 may include selection circuitry that is configured to receive the identified master delay line signals from the master delay line 102 and select pairs of the signals for comparison. The selection circuitry may further be configured to selectively and/or sequentially output the selected pairs for comparison. The selection circuitry may include a first multiplexer (MUX1) 202 and a second multiplexer (MUX2) 204. The first multiplexer 202 may be configured to receive master delay line signals of the pairs that are to be communicated through the slave delay line 104. The second multiplexer 204 may be configured to receive master delay line signals of the pairs that are to be compared with the master delay line signals sent to the first multiplexer 202 after the latter signals are communicated through the slave delay line 104.

The programming delay tuning circuit 124 may further include a controller 206. The controller 206 may be configured to receive each of the one or more pairs of master delay line signals identified under the selection scheme, and for each pair, compare the phases of the master delay line signals and determine a phase difference between the phases.

In addition, the controller 206 may be configured to receive the initial programming delay value PRG_DEL, such as from an external controller that is external to the system 100, the master-slave DLL circuit, and/or the programming delay tuning circuit 124. The controller 206 may also be configured to generate and output the programming delay output value PRG_DEL_OUT to the SDL bias generator 112. The programming delay output value PRG_DEL_OUT, along with the control voltage $V_{CTRL}$, may be used to generate the slave bias voltage $V_{sb}$, as previously described.

The controller 206 may further be configured to determine whether to adjust and/or tune the initial programming delay value PRG_DEL based on the determined one or more phase differences of the one or more pairs of master delay line signals. For example, from the one or more phase differences, the controller 206 may be configured to determine whether adjustment of one or more bits of the initial programming delay PRG_DEL may yield an actual phase delay of the output signal SIG_OUT that is closer to the desired phase delay than if the initial programming delay value is used instead. If so, then the controller 206 may adjust and/or tune the initial programming delay value PRG_DEL to generate a tuned programming delay value. The tuned programming delay value may then be the programming delay output value PRG_DEL_OUT sent to the SDL bias generator 112. Alternatively, if not, then the controller 206 may not adjust and/or tune the initial programming delay value PRG_DEL, and the initial programming delay value PRG_DEL may be the programming delay output value PRG_DEL_OUT sent to the SDL bias generator 112.

Where the selection scheme identifies only a single pair of master delay line signals to be selected and compared, the controller 206 may be configured to determine whether to adjust the initial programming delay value PRG_DEL based on the single phase difference. Alternatively, when the selection scheme identifies multiple pairs of master delay line signals to be selected and compared, the controller 206 may be configured to determine an average of the multiple phase differences associated with the multiple pairs. The controller 206 may then be configured to determine whether to adjust and/or how much to adjust the initial programming delay value PRG_DEL based on the average.

The controller 206 may further be configured to control selection of the pairs of master delay line signals being selected by the first multiplexer 202 and the second multiplexer 204. The controller 206 may be configured to generate and/or output selection signals or signal buses SEL1 and SEL2 to the first multiplexer 202 and the second multiplexer 204, respectively. For some example configurations, the selection signals SEL1 and SEL2 may be difference signals sent to their respective multiplexers 202, 204. Alternatively, the selection signals may be the same signal. That is, the controller 206 may be configured to output only a single selection signal to control both the first multiplexer 202 and the second multiplexer 204.

The first and second multiplexers 202, 204 may be configured to receive their respective selection signals SEL1, SEL2. Based on the received selection signals SEL1, SEL2, the first and second multiplexers 202, 204 may each be configured to select and output one of the received master delay line signals as respective multiplexer output signals MUX1_OUT and MUX2_OUT.

The controller 206 may be configured to select the pairs of master delay line signals to be output by the first and second multiplexers 202, 204 and/or output the selection signals SEL1, SEL2 in accordance with the predetermined selection scheme. In addition, the controller 206 may be configured to select a next pair of master delay line signals for comparison under the selection scheme in response to determining and/or registering a phase difference between the master delay line signal of the last, prior pair that was selected.

To illustrate, FIG. 2 shows the first and second multiplexers 202, 204 as being configured to receive pairs of master delay line signals under a predetermined selection scheme where signals of each pair are spaced apart by an N-number of master delay cells, where a next pair to be selected has a master delay line signal in common with the last, prior pair that was selected and compared, and where the common master delay line signal is not communicated through the slave delay line 104 when part of the last, prior pair of master delay line signals, and is communicated through the slave delay line 104 when part of the next pair of master delay line signals. In particular, for the master and slave delay lines 102, 104 where N=2 and M=8, four pairs of master delay line signals are input into the multiplexers 202, 204 making up the selection circuitry—a first pair including the reference signal REF_SIG and the second master delay line signal PH1, a second pair including the second master delay line signal PH1 and the fourth master delay line signal PH3, a third pair including the fourth master delay line signal PH3 and the sixth master delay line signal PH5, and a fourth pair including the sixth master delay line signal PH5 and the eighth master delay line signal PH7. In further detail, the master delay line signals of the pairs that are received by the first multiplexer 202 and sent to the slave delay line 104 are the reference signal REF_SIG of the first pair, the second master delay line signal PH1 of the second pair, the fourth master delay line signal PH3 of the third pair, and the sixth master delay line signal PH5 of the fourth pair. The master delay line signals of the pairs that are received by the second multiplexer 204 are the second master delay line signal PH1 of the first pair, the fourth master delay line signal PH3 of the second pair, the sixth master delay line signal PH5 of the third pair, and the eighth master delay line signal PH7 of the fourth pair. Additionally, under the selection scheme, the controller 206 may be configured to select the first pair first, the second pair second, the third pair third, and the fourth pair fourth.

To perform tuning of the initial programming delay value, the controller 206 be configured to initially provide the initial programming delay value PRG_DEL as the programming delay output value PRG_DEL_OUT to the SDL bias generator 112, which in turn may generate the slave bias voltage $V_{sb}$ so that the slave delay line 104 has an initial associated phase delay based on the initial programming delay value PRG_DEL.

In addition, the controller 206 may be configured to output the selection signals SEL1, SEL2 to the first and second multiplexers 202, 204 such that the first pair of master delay line signals are output first—i.e., the first multiplexer output MUX1_OUT is the reference signal REF_SIG and the second multiplexer output MUX2_OUT is the second master delay line signal PH1. The reference signal REF_SIG may be sent to the slave delay line 104 as the output TNG_CIR_OUT of the programming delay tuning circuit 124. The reference signal REF_SIG may be communicated through the slave delay line 104 and a delayed version of the reference signal REF_SIG may be output from the slave delay line 104 as the output SIG_OUT of the slave delay line 104. As shown in FIG. 2, the delayed version of the reference signal REF_SIG may be sent to the controller 206, which may compare the delayed version of the reference signal REF_SIG with the second master delay line signal PH1 being output by the second multiplexer 204. Based on the comparison, the controller 206 may determine a phase difference between the delayed version of the reference signal REF_SIG and the second master delay line signal PH1. The controller 206 may be configured to register or otherwise store the determined phased difference.

After determining the phase difference between the delayed version of the reference signal REF_SIG and the second master delay line signal PH1 and/or registering the determined phase difference, the controller 206 may select the next (i.e., second) pair of master delay line signals and output the selection signals SEL1 and SEL2 such that the second pair is output by the first and second multiplexers 202, 204, respectively. After determining and/or registering a phase difference between a delayed version of the second master delay line signal PH1 and the fourth master delay line signal PH3, the controller 206 may output the selection signals SEL1 and SEL2 such that the third pair is output by the first and second multiplexers 202, 204, respectively. After determining and/or registering a phase difference between a delayed version of the fourth master delay line signal PH3 and the sixth master delay line signal PH5, the controller 206 may output the selection signals SEL1 and SEL2 such that the fourth pair is output by the first and second multiplexers 202, 204. A phase difference between a delayed version of the sixth master delay line signal PH5 and the eighth master delay line signal PH7 may be determined and/or registered. There-after, the controller 206 may determine that there are no more pairs of master delay line signals to select and compare under the selection scheme.

Subsequently, the controller 206 may be configured to determine an average of the registered phase differences. Based on the average, the controller 206 may determine whether and/or how much to tune the initial programming delay value PRG_DEL. Based on the determination, the controller 206 may tune output a tuned programming delay value as the programming delay output value PRG_DEL_OUT or alternatively continue outputting the initial programming delay value PRG_DEL as the programming delay output value PRG_DEL_OUT to the SDL bias generator 112. If the initial programming delay value PRG_DEL was tuned, then a new or adjusted slave bias voltage Vsb may be generated based on the control voltage $V_{CTRL}$ and the tuned programming delay value, which in turn may tune the associated phase delay of the slave delay line 104.

The programming delay tuning circuit 124 may further include a third multiplexer (MUX3) 208 that is configured to receive and selectively output the output MUX1_OUT of the first multiplexer 202 and an input signal SIG_IN to the system 100 and/or the master-slave DLL circuit. The input signal SIG_IN may be a phase-aligned signal that is phase-aligned with the reference signal REF_SIG and/or a data signal (not shown). In addition or alternatively, the input signal SIG_IN may be a signal that is desired or intended to have its phase delayed by the slave delay line 104. An example input signal SIG_IN may be a strobe signal used to latch data of a data signal (not shown) that is phase-aligned with the data signal. So that the strobe signal may be used to latch the data at both rising edges and falling edges of the strobe signal, it may be desirable for the strobe signal to have a desired phase offset, such as 90 degrees, from the data signal. Accordingly, the strobe signal may be sent to the slave delay line 104 of the master-slave DLL circuit to generate a delayed version of the strobe signal with the desired delay.

When the controller 206 determines to perform tuning of the initial programming delay value PRG_DEL, the controller 206 may be configured to output a tuning enable signal TNG_EN that configures the third multiplexer 208 to output the output MUX1_OUT of the first multiplexer 202. Alternatively, when the controller 206 determines not to perform tuning of the initial programming delay value PRG_DEL, the controller 206 may output the tuning enable signal TNG_EN such that the third multiplexer 208 is configured to output the input signal SIG_IN.

In one example situation, the controller 206 may determine not to perform tuning after it has finished performing tuning. To illustrate, using the example above, after the fourth (i.e., last) pair of master delay line signals is compared, the average value is determined, and any tuning of the initial programming delay value PRG_DEL is performed, the controller 206 may be configured to output the tuning enable signal TNG_EN to configure the third multiplexer 208 such that the input signal SIG_IN, rather than the output MUX1_OUT of the first multiplexer 202, may be communicated to the slave delay line 104. In turn, the slave delay line 104 may delay the input signal SIG_IN after having its associated phase delay tuned.

In another example situation, the controller 206 may determine not to perform tuning if the master-slave DLL is not yet locked. That is, it may be undesirable for the controller 206 to perform tuning on the initial programming delay value PRG_DEL it is receiving if the master-slave DLL circuit, itself, is not yet locked. Accordingly, the controller 206 may be configured to receive the lock signal LOCK being output by the lock detector 120 (FIG. 1). If the lock signal LOCK indicates that the master-slave DLL circuit is not locked, then the controller 206 may determine not to perform any tuning of the received programming delay value PRG_DEL.

In addition, as shown in FIG. 1, the controller 206 may be configured to receive a clock signal CLK to control timing of its operations and/or function being performed. The clock signal CLK may be received from one of various sources. In one example configuration, the clock signal CLK may be the output MUX1_OUT of the first multiplexer 202. Alternatively, the clock signal CLK may be the reference signal REF_SIG. In another alternative configuration, the clock signal CLK may be an external input to the system 100 having a clock frequency at least as fast as the frequency of the reference signal REF_SIG.

Figure 3:
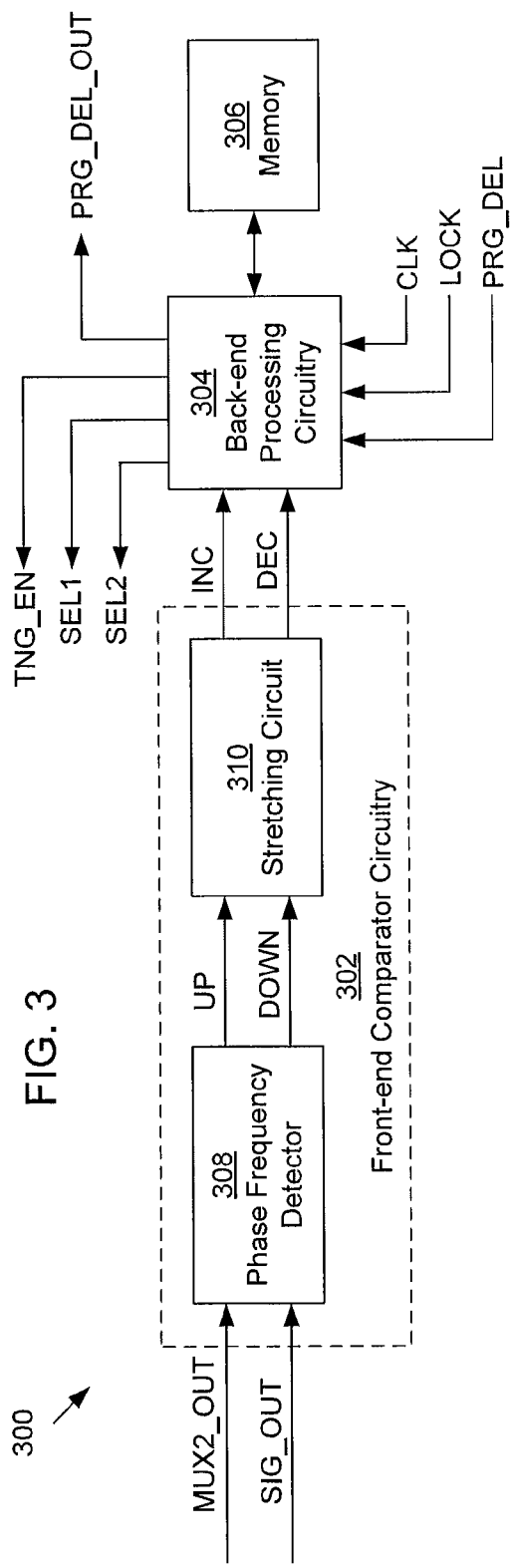
FIG. 3 is a block diagram of an example configuration of a controller of the tuning circuit shown in FIG. 2.

FIG. 3 shows an example circuit implementation 300 of the controller 206. The example circuit implementation 300 may include front-end comparator circuitry 302 that may be configured to receive and determine a phase difference between the output MUX2_OUT of the second multiplexer 204 and the output SIG_OUT of the slave delay line 104. Based on the phase difference, the front-end multiplexer circuitry 302 may output increase and decrease signals INC, DEC that indicate whether and/or how much to adjust and/or tune the initial programming delay value PRG_DEL.

The example circuit implementation 300 of the controller 206 may further include back-end processing circuitry 304 that may be configured to receive the increase and decrease signals INC, DEC from the front-end comparator circuitry 302. Based on the increase and decrease signals INC, DEC the back-end processing circuitry 304 may be configured to adjust and/or tune the initial programming value PRG_DEL. In particular, in response to receipt of the increase signal INC, the back-end processing circuitry 304 may be configured to increase the initial programming delay value PRG_DEL and by an amount indicated by the increased signal INC. Additionally, in response to receipt of the decrease signal DEC, the back-end processing circuitry 304 may be configured to decrease the initial programming delay value PRG_DEL and by an amount indicated by the decrease signal DEC.

For some example configurations, the back-end processing circuitry 304 may be configured to register and/or store a value indicative of an amount that the initial programming delay value PRG_DEL is to be increased or decreased, as indicated by the increase and/or decrease signals INC, DEC. As previously described, multiple pairs of master delay line signals may be communicated to the controller 206 as output signals MUX2_OUT and SIG_OUT to determine multiple phase differences associated with the multiple pairs. An average of the multiple phase differences may then be determined, which may be used to adjust the initial programming delay value PRG_DEL. Accordingly, the back-end processing circuitry 304 may be configured to receive multiple increase and/or decrease signals INC, DEC from the front-end comparator circuitry 302, each generated based on one of the multiple pairs of master delay line signals. When all of the pairs of master delay line signals are communicated to the front-end comparator circuitry 302 and multiple values indicating the amounts to increase or decrease the initial programming delay value PRG_DEL are registered and/or stored, the back-end processing circuitry 304 may be configured to determine an average value of the multiple values. The back-end processing circuitry 304 may then be configured to use the average value to determine whether and/or how much to adjust and/or tune the initial programming delay value PRG_DEL.

For some example configurations, the back-end processing circuitry 304 may be configured to increase and decrease the initial programming delay value PRG_DEL in increments and decrements determined by a step size or a count number. For example, the back-end processing circuitry 304 may include a counter that is configured to identify the initial programming value PRG_DEL as and/or associate the initial programming value PRG_DEL with an initial count value. In response to the increase and decrease signals INC, DEC and/or an average value determined from multiple increase and/or decrease signals INC, DEC, the counter may be configured to increase or decrease the initial count value by a corresponding number of counts or steps. In addition or alternatively, where the initial programming delay value PRG_DEL is a multi-bit value as previously described, the increase or decrease in the initial programming delay value PRG_DEL may correspond to a change in one or more bits of the multi-bit value.

In addition to tuning and/or adjusting the initial programming delay value PRG_DEL, the back-end processing circuitry 304 may be configured to perform other functions of the controller 206. For example, the back-end processing circuitry 304 may be configured to generate and output the programming delay output value PRG_DEL_OUT to the SDL bias generator 112, either as the initial programming delay value PRG_DEL or the tuned programming delay value. In addition, the back-end processing circuitry 304 may be configured to output the selection signals SEL1, SEL2 to the first and second multiplexers 202, 204, respectively. Also, the back-end processing circuitry 304 may be configured to determine whether to perform tuning of the initial programming delay value PRG_DEL, such as in response to receipt of the lock signal LOCK, and generate and output the tuning enable signal TNG_EN to the third multiplexer 208, as previously described.

The back-end processing circuitry 304 may include and/or use one or more state machines to perform its functions. In addition, the back-end processing circuitry 304 may be implemented in hardware or some combination of hardware and software. For example, the back-end processing circuitry 304 may be implemented in hardware logic and/or digital logic. In addition or alternatively, the back-end processing circuitry 304 may include and/or be implemented as at least one general processor, digital signal processor, a controller, a microcontroller, an application specific integrated circuit, a field programmable gate array, an analog circuit, a digital circuit, combinations thereof, or other now known or later developed processors. The processors may be configured together or separately, and together or separately, they may be a single device, a plurality of devices, or a combination of devices, such as associated with a network or distributed processing. Any of various processing strategies may be used, such as multi-processing, multi-tasking, parallel processing, remote processing, or the like. The processors may be responsive to and/or configured to execute instructions stored as part of software, hardware, integrated circuits, firmware, microcode, or the like.

For some example configurations, the back-end processing circuitry 304 may be configured to communicate with, access, and/or perform its functions using a memory 306. The memory 306 may be non-transitory computer readable storage media. The computer readable storage media may include various types of volatile and non-volatile storage media, including but not limited to random access memory, read-only memory, programmable read-only memory, electrically programmable read-only memory, electrically erasable read-only memory, flash memory, magnetic tape or disk, optical media, and the like. The memory 306 may be configured together or separately and/or and may be a single device or a combination of devices. The memory 306 may be adjacent to, part of, networked with and/or removable from the processor. Logic encoded in one or more non-transitory computer readable storage media for execution is defined as the instructions that are executable by the back-end processing circuitry 304 and that are provided on the computer-readable storage media, memories, or a combination thereof.

The memory 306 may be a computer readable storage media having stored therein data representing instructions executable by the back-end processing circuitry 304. The memory 306 may store instructions for the back-end processing circuitry 306. The back-end processing circuitry may be programmed with and execute the instructions. The functions, acts, methods, or tasks illustrated in the figures or described herein may be performed by the back-end processing circuitry 304 executing the instructions stored in the memory 306. The functions, acts, methods or tasks may be independent of the particular type of instructions set, storage media, processor or processing strategy and may be performed by software, hardware, integrated circuits, firmware, micro-code, and the like, operating alone or in combination. The instructions may be for implementing the processes, techniques, methods, or acts described herein.

For the example circuit implementation 300, the front-end comparator circuitry 302 may include a phase frequency detector 308 that is configured to receive the output MUX2_OUT of the second multiplexer 204 and the output SIG_OUT of the slave delay line 104. Based on the received outputs MUX2_OUT and SIG_OUT, the phase frequency detector 308 may be configured to generate UP and DOWN signals. The UP and DOWN signals may be generated based on a time difference between edges, such as rising edges, of the output MUX2_OUT of the second multiplexer 204 and the output SIG_OUT of the slave delay line 104. The UP and DOWN signals may indicate which of the edges arrives first. In particular, if an edge of the output MUX2_OUT arrives before an edge of the output SIG_OUT, then the phase frequency detector 308 may output the UP signal (or the UP signal may be output at a logic high level while the DOWN signal may be output at a logic low level). Alternatively, if an edge of the output SIG_OUT arrives at the same time or before an edge of the reference signal MUX2_OUT, then the phase frequency detector 308 may output the DOWN signal (or the DOWN signal may be output at a logic high level while the UP signal may be output at a logic low level).

The phase frequency detector 308 may be configured to output the UP and DOWN signals to a stretching circuit 310. The stretching circuit 310 may be configured to temporarily stretch or extend time differences indicated in the UP and DOWN signals. The stretching circuit 310 may be included because the time differences indicated in the UP and DOWN signals may be too small for recognition and/or use by the back-end processing circuitry 304 due to small (e.g., on the order of picosecond) differences in arrival times of the edges of the outputs MUX2_OUT and SIG_OUT. The stretching circuit 310 may be configured to temporarily stretch or extend the time differences to generate the increase and decrease signals INC, DEC, which may then be output to the back-end processing circuitry 304.

Figure 4:
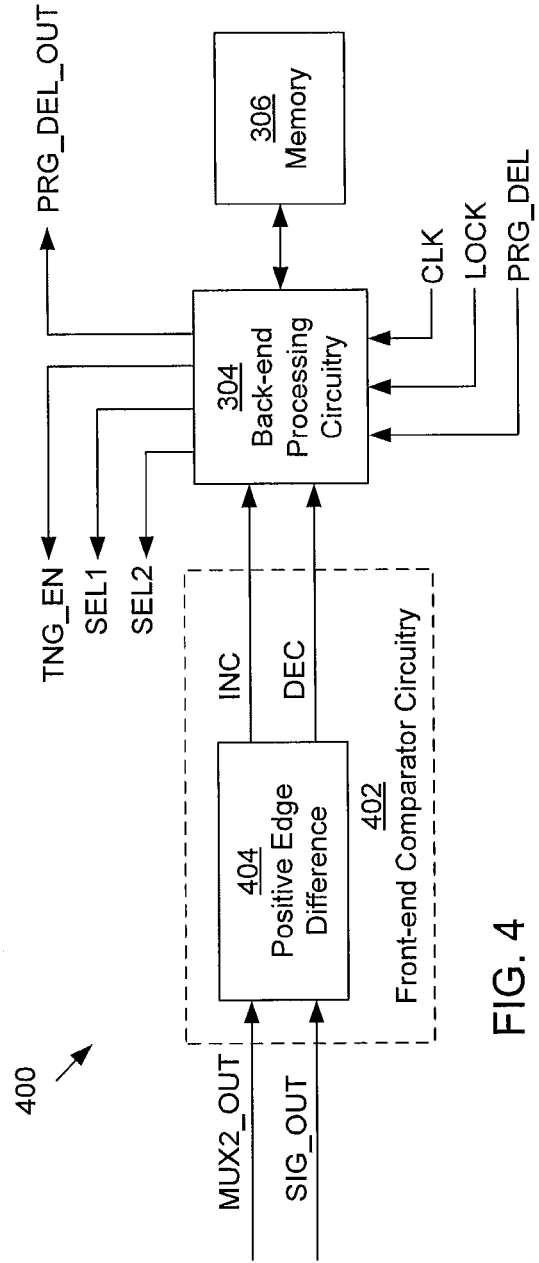
FIG. 4 is a block diagram of another example configuration of the controller shown in FIG. 2.

FIG. 4 shows another example circuit implementation 400 of the controller 206.

The example circuit implementation 400 may be similar to the example circuit implementation 300 shown in FIG. 3, except that instead of having both a phase detector and a stretching circuit, a front-end comparator circuitry 402 may include a positive edge difference circuit 404 that is configured to receive the outputs MUX2_OUT, SIG_OUT and generate the increase and decrease signals INC, DEC based on the outputs MUX2_OUT, SIG_OUT.

Figure 5:
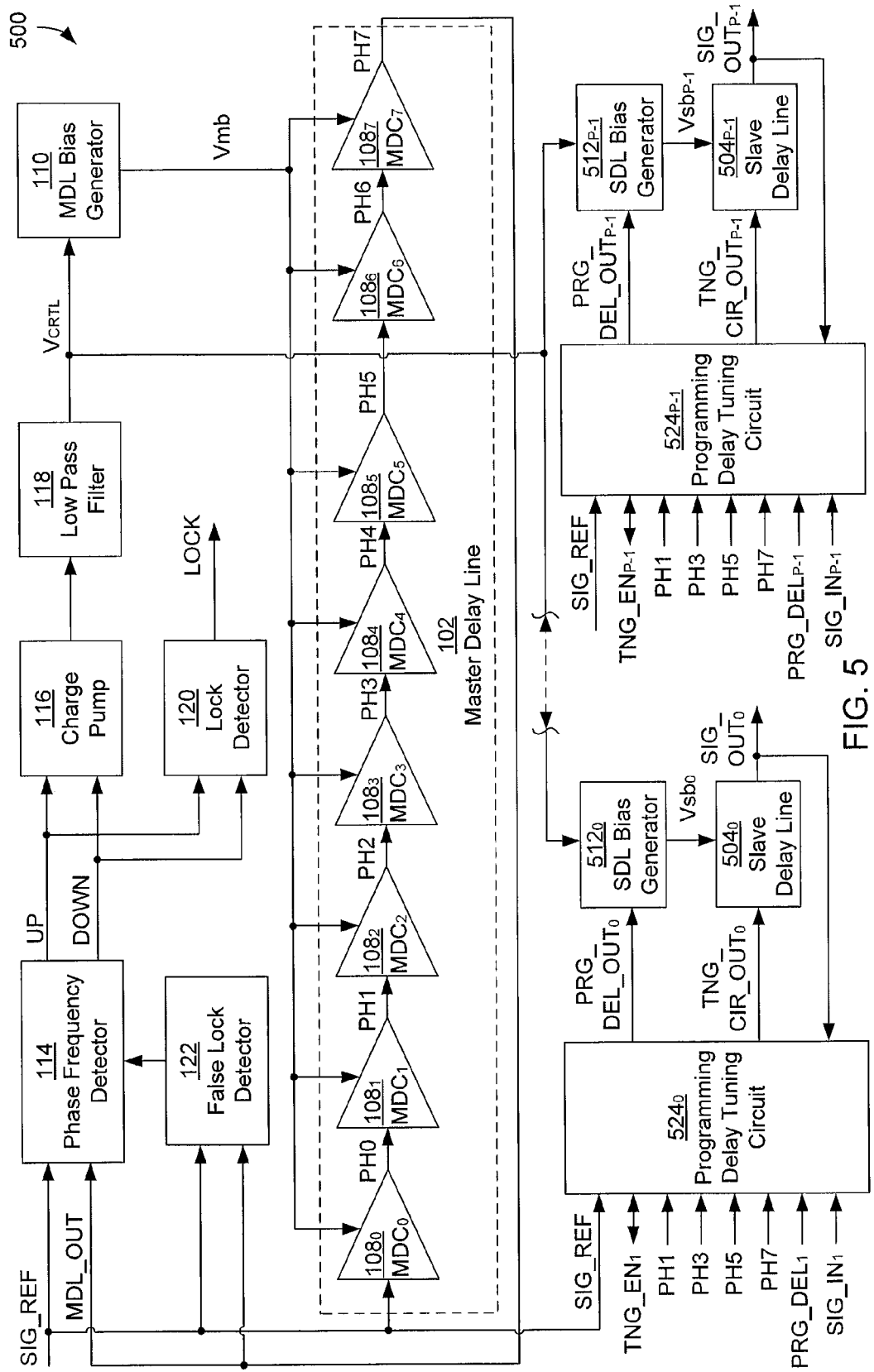
FIG. 5 is a block diagram of another example system that includes a master-slave delay locked loop circuit and tuning circuitry that independently tunes programming delay values for a plurality of slave delay lines.

FIG. 5 shows another example system 500, which may be similar to the example system 100 except that instead of having a single slave delay line 104, the example system 500 may include a plurality or a P-number of slave delay lines $504_0$ to $504_{P-1}$, where P is two or more. The P-number of slave delay lines $504_0$ to $504_{P-1}$ may each be configured to generate one of a P-number of output signals $SIG\_OUT_0$ to $SIG\_OUT_{P-1}$, each having a phase that is delayed or offset relative to a phase of a respective input signal $SIG\_IN_0$ to $SIG\_IN_{P-1}$. The input signals $SIG\_IN_0$ to $SIG\_IN_{P-1}$ may be the same signal or alternatively they may be different signals. For some example configurations, the slave delay lines $504_0$ to $504_{P-1}$ may have the same desired phase delay and/or have the same number of slave delay cells as each other. Alternatively, one or more of the slave delay lines $504_0$ to $504_{P-1}$ may have different desired phase delays and/or have different numbers of slave delay cells from each other. The system 500 may also include a P-number of SDL bias generators $512_0$ to $512_{P-1}$, each configured to separately or independently supply a respective slave bias voltage $V_{sb0}$ to $V_{sbP-1}$ to an associated slave delay line $504_0$ to $504_{P-1}$.

In addition, the system 500 may include tuning circuitry that has a P-number of programming delay tuning circuits $524_0$ to $524_{P-1}$. Each of the programming delay tuning circuits $524_0$ to $524_{P-1}$ may be configured to output a respective one of a P-number of programming delay output values $PRG\_DEL\_OUT_0$ to $PRG\_DEL\_OUT_{P-1}$ to an associated SDL bias generator $512_0$ to $512_{P-1}$ and an output $TNG\_CIR\_OUT_0$ to $TNG\_CIR\_OUT_{P-1}$ to an associated slave delay line $504_0$ to $504_{P-1}$. In addition, each of the programming delay tuning circuits $524_0$ to $524_{P-1}$ may be configured to separately or independently tune a P-number of initial programming delay values $PRG\_DEL_0$ to $PRG\_DEL_{P-1}$ to generate respective tuned programming delay values as the programming delay output values $PRG\_DEL\_OUT_0$ to $PRG\_DEL\_OUT_{P-1}$. The initial programming delay values $PRG\_DEL_0$ to $PRG\_DEL_{P-1}$ may be the same as or different from each other, depending on the desired phase delays, the actual phase delays, and/or differences between the desired and actual phase delays of the slave delay lines $504_0$ to $504_{P-1}$. Each of the programming delay tuning circuits $524_0$ to $524_{P-1}$ may tune the respective initial programming delay values $PRG\_DEL_0$ to $PRG\_DEL_{P-1}$ by separately or independently selecting and comparing one or more pairs of master delay line signals, where one of the signals of each pair is passed through an associated one of the slave delay lines $504_0$ to $504_{P-1}$ prior to the comparison. Each of the SDL bias generators $512_0$ to $512_{P-1}$ may receive a respective one of the tuned programming delay value $PRG\_DEL\_TND_0$ to $PRG\_DEL\_TND_{P-1}$ along with the control voltage $V_{CTRL}$ to generate a respective slave bias voltage $V_{sb0}$ to $V_{sbP-1}$.

The P-number of programming delay tuning circuits $524_0$ to $524_{P-1}$ making up the tuning circuitry may be implemented in various ways. For example, each of the programming delay tuning circuits $524_0$ to $524_{P-1}$ may be separately configured as shown and described with reference to FIGS. 2-4. Alternatively, one or more of the components of the programming delay tuning circuits $524_0$ to $524_{P-1}$ may be common or shared. For example, the programming delay tuning circuits $524_0$ to $524_{P-1}$ may have a common back-end processing circuitry and/or memory that may be configured to perform a P-number of tunings or adjustments of the initial programming delay value PRG_DEL and generate and output a P-number of programming delay output values $PRG\_DEL\_OUT_0$ to $PRG\_DEL\_OUT_{P-1}$ to respective SDL bias generators $512_0$ to $512_{P-1}$. Various configuration or combinations of configurations for the programming delay tuning circuits $524_0$ to $524_{P-1}$ may be possible.

Figure 6:
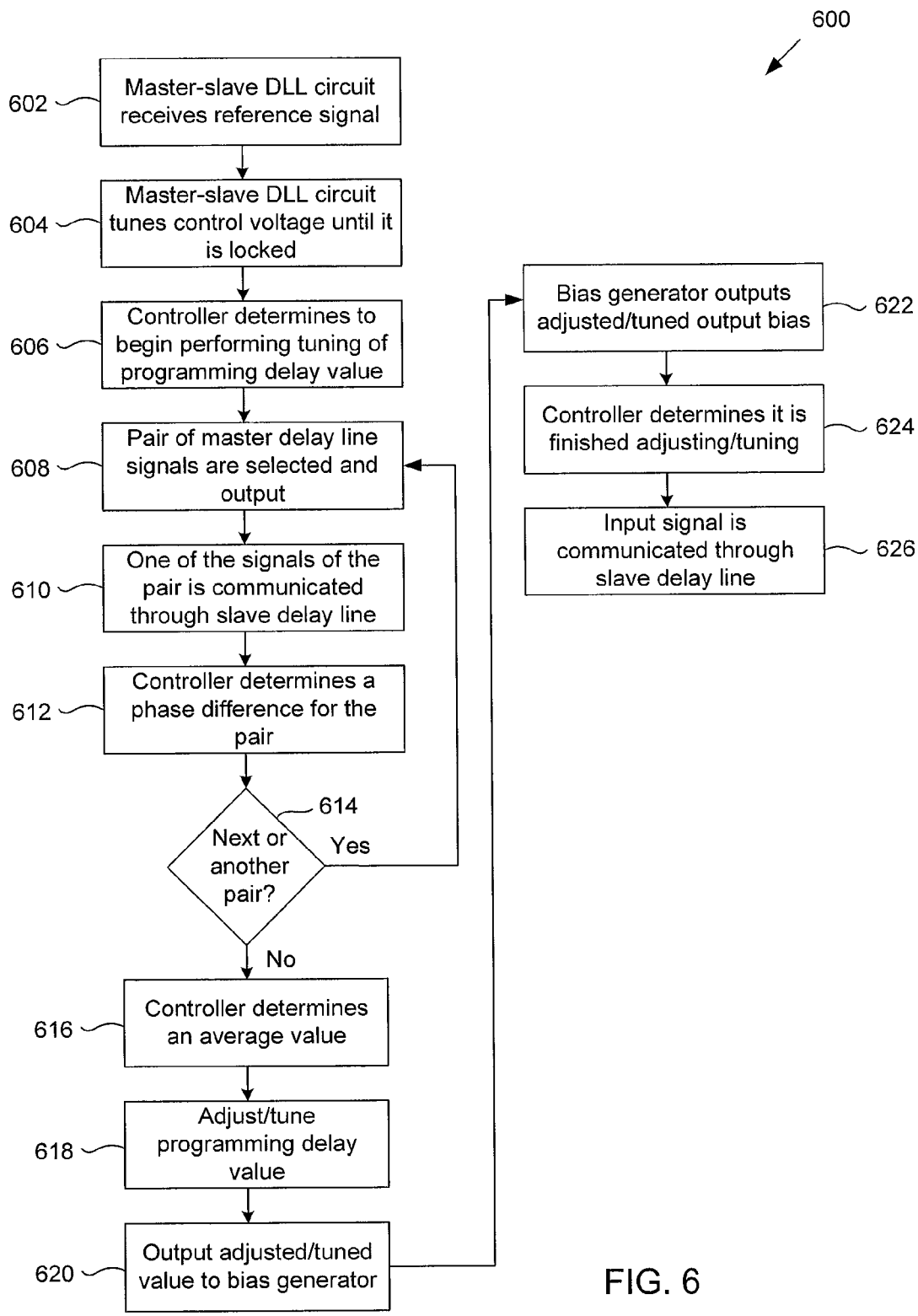
FIG. 6 is a flow chart of an example method of adjusting a program delay value used to set a phase delay of a slave delay line of a master-slave delay locked loop.

FIG. 6 shows an example method 600 of tuning at least one initial programming delay value to generate at least one tuned programming value used to set at least one phase delay of at least one slave delay line of a master-slave DLL circuit. For simplicity, the example method 600 is described with reference to tuning an initial programming delay value to generate a tuned programming value for a single slave delay line. However, the method 600 may be equally applicable for a plurality of slave delay lines where one or more initial programming delay values are separately or independently tuned to generate a plurality of tuned programming values for the plurality of slave delay lines.

At block 602, a reference signal, such as a reference clock signal, may be received by the master-slave DLL circuit. In particular, the reference signal may be received by locking circuitry and a master delay line of the master-slave DLL circuit. At block 604, the master-slave DLL circuit may adjust and/or tune a control voltage used to generate a master bias voltage being applied to master delay cells of the master delay line until the master delay line is stably outputting an output signal that is phase-delayed one period or 360-degrees out of phase from the reference signal, at which point the master-slave DLL circuit may be locked, and the locking circuitry may output a lock signal.

At block 606, a controller of a programming delay tuning circuit may receive the lock signal from the locking circuitry. In response, the controller may be configured to determine to begin performing tuning of a programming delay value that is used to set a slave bias voltage on slave delay cells of the slave delay line. The programming delay value may be an initial value that is determined and/or selected from among a plurality of programming delay values based on a desired phase delay of the slave delay line, an actual phase delay of the slave delay line once the master-slave DLL circuit is locked, and/or a phase difference between the actual phase delay and the desired phase delay. The programming delay value may be received by the controller instead of being directly received by a slave delay line bias generator that generates the slave bias voltage.

In addition, at block 606, in response to determining to begin performing tuning of the programming delay value, the controller may output a tuning enable signal to a multiplexer providing an output to an input of the slave delay line. In response to the tuning enable signal, the multiplexer may switch from being configured to output an input signal that is phase-aligned with the reference signal to the slave delay line, to being configured to output one or more master delay line signals from the master delay line to the slave delay line.

At block 608, a pair of master delay line signals being generated at various points along the master delay line may be selected and output for a phase difference comparison. The pair may be selected from among a plurality of pairs of master delay line signals that are to be compared. For some example methods, the controller may select the pair from among the plurality of pairs in accordance with a selection scheme that identifies the pairs of master delay line signals to be compared and/or an order in which the pairs may be compared, as previously described.

The pairs of master delay line signals to be selected and compared may be communicated to selection circuitry of the programming delay tuning circuit. In some example methods, for each pair, a first master delay line signal of the pair may be communicated to a first multiplexer and a second master delay line signal of the pair may be communicated to a second multiplexer.

To select the pair from among the plurality of pairs, the controller may generate and output to the selection circuitry one or more selection signals. In response to receiving the one or more selection signals, the selection circuitry may output the selected pair of master delay line signals. For example, in response to receiving a first selection signal, the first multiplexer may select and output the first master delay signal from among a plurality of master delay line signal that it is receiving, and the second multiplexer may select and output the second master delay line signal from among a plurality of master delay line signals that it is receiving.

At block 610, the first master delay line signal of the pair selected at block 608 may be communicated through the slave delay line to generate a delayed first master delay line signal, and the second master delay line signal of the pair may not be communicated through the slave delay line. At block 612, the controller may receive the delayed first master delay line signal and the second master delay line signal and determine a phase difference between the two signals. In addition, at block 612, the controller may register the phase difference.

At block 614, the controller may determine if another or a next pair of master delay line signals is to be selected for the phase difference comparison. For some example methods, the controller may make the determination based on a selection scheme, as previously described. If another or next pair of master delay line signals is to be selected, then the method 600 may proceed back to block 608 for the selection. If not, then the method 600 may proceed to block 616. For alternative methods, if only a single pair of master delay line signals is compared, then the selection at block 608 may be skipped and the method may proceed directly from block 606 to block 610, where one of the master delay line signals from the pair may be communicated through the slave delay line.

At block 616, the controller may determine an average value of the plurality of determined and registered phase differences. For alternative methods, if the controller performed only a single comparison to determine a single phase difference, then the controller may use the single phase difference as the average value. At block 618, the controller may adjust and/or tune the programming delay value by an amount corresponding to the average value. As previously described, for some examples, the average value may correspond to a number of count values or step sizes by which to adjust the programming delay value. In addition or alternatively, where the programming delay value is a multi-bit value made up of multiple bits, the average value may indicate which and/or how many of the multiple bits to change from a logic low (zero) value to a logic high (one) value, or vice versa.

At block 620, the controller may output an adjusted and/or tuned programming delay value as an output programming delay value to the slave delay line bias generator. In response, at block 622, the slave delay line bias generator may output an adjusted and/or tuned slave bias voltage to the slave delay cells making up the slave delay line.

At block 624, the controller may determine that it is finished tuning the programming delay value and may output a tuning disable signal to the multiplexer providing an output to the slave delay line. In response to receipt of the tuning disable signal, the multiplexer may switch back to being configured to output to the slave delay line the input signal that is phase-aligned with the reference signal.

At block 626, the input signal may be communicated from the output of the multiplexer through the slave delay line, where the input signal may be phase delayed by slave delay cells that are being biased by a slave bias voltage set to a level that is based, at least in part, by the tuned programming delay value.

It is intended that the foregoing detailed description be understood as an illustration of selected forms that the embodiments can take and does not intend to limit the claims that follow. Also, some of the following claims may state that a component is operative to perform a certain function or configured for a certain task. It should be noted that these are not restrictive limitations. It should also be noted that the acts recited in the claims can be performed in any order—not necessarily in the order in which they are recited. Additionally, any aspect of any of the preferred embodiments described herein can be used alone or in combination with one another. In sum, although the present invention has been described in considerable detail with reference to certain embodiments thereof, other versions are possible. Therefore, the spirit and scope of the appended claims should not be limited to the description of the embodiments contained herein.

We claim:

1. A circuit configured to adjust a programming delay value used to set a phase delay of a slave delay line of a master-slave delay locked loop (DLL) circuit, the circuit comprising:
a controller configured to:
determine a phase difference between a pair of master delay line signals generated at different points of a master delay line of the master-slave DLL circuit, wherein one of the master delay line signals of the pair is communicated through the slave delay line before the phase difference is determined;
adjust a programming delay value based on the phase difference to generate an adjusted programming delay value; and
output the adjusted programming delay value to a bias generator that generates an output bias based on the adjusted programming delay value and supplies the output bias to the slave delay line to set a phase delay of the slave delay line.

2. The circuit of claim 1, wherein the controller is further configured to:
determine a plurality of phase differences, each being between one of a plurality of different pairs of master delay line signals selected from a plurality of master delay line signals, wherein for each of the different pairs, one of the master delay line signals is communicated through the slave delay line before a respective phase difference of the pair is determined; and
generate the adjusted programming delay value based on the plurality of phase differences.

3. The circuit of claim 2, wherein the controller is further configured to:
determine an average of the plurality of phase differences; and
adjust the programming value to generate the adjusted programming delay value based on the average.

4. The circuit of claim 2, further comprising:
selection circuitry configured to receive the plurality of master delay line signals,
wherein the controller is further configured to select the pair of master delay line signals from among the plurality of different pairs of master delay line signals, and
wherein the selection circuitry is further configured to output the pair of master delay line signals in response to the selection, wherein a first master delay line signal of the pair is output to the slave delay line and a second master delay line signal of the pair is output to the controller.

5. The circuit of claim 4, wherein the pair of master delay line signals comprises a prior pair, and wherein the controller is further configured to select a next pair of master delay line signals from among the plurality of different pairs of master delay line signals, wherein one of the master delay line signals of the next pair is common with the prior pair, and
  in response to the selection of the next pair, the selection circuitry is configured to output the next pair, wherein one of the next pair of master delay line signal is output to the slave delay line and the other of the next pair is output to the controller.

6. The circuit of claim 4, wherein the selection circuitry comprises a first multiplexer and a second multiplexer,
  wherein the first multiplexer is configured to:
    receive first master delay line signals of the different pairs; and
    output each of the first master delay line signals to the slave delay line; and
  wherein the second multiplexer is configured to:
    receive second master delay line signals of the different pairs; and
    output each of the second master delay line signals to the controller.

7. The circuit of claim 1, wherein the different points at which the master delay line signals of the pair are generated are separated by a number of master delay cells of the master delay line that is equal to a number of slave delay cells in the slave delay line.

8. The circuit of claim 1, wherein an intended phase difference between the pair of master delay line signals is equal to a desired phase delay of the slave delay line.

9. A method of adjusting an initial programming delay value used to set a phase delay of a slave delay line of a master-slave delay locked loop (DLL) circuit, the method comprising:
  communicating a first master delay line signal of a pair of master delay line signals through the slave delay line to generate a delayed first master delay line signal;
  receiving, with a controller, the delayed first master delay line signal from an output of the slave delay line and a second master delay line signal of the pair;
  determining, with the controller, a phase difference between the delayed first master delay line signal and a second master delay line signal of the pair;
  generating, with the controller, an adjusted programming delay value that is adjusted from the initial programming delay value based on the phase difference; and
  outputting, with the controller, the adjusted programming delay value to a bias generator that generates an output bias based on the adjusted programming delay value and supplies the output bias to the slave delay line to set a phase delay of the slave delay line.

10. The method of claim 9, further comprising:
  determining, with the controller, a plurality of phase differences, each being between one of a plurality of different pairs of master delay line signals selected from a plurality of master delay line signals, wherein for each of the different pairs, one of the master delay line signals is communicated through the slave delay line before a respective phase difference of the pair is determined, and
  wherein generating the adjusted programming delay value comprises generating, with the controller, the adjusted programming delay value based on the plurality of phase differences.

11. The method of claim 10, further comprising:
  determining, with the controller, an average of the plurality of phase differences,
  wherein generating the adjusted programming delay value based on the plurality of phase differences comprises adjusting, with the controller, the adjusted programming delay value based on the average of the plurality of phase differences.

12. The method of claim 10, further comprising:
  receiving, with selection circuitry, the plurality of master delay line signals;
  selecting, with the controller, the pair of master delay line signals from among the plurality of different pairs of master delay line signals; and
  in response to selecting the pair:
    outputting, with the selection circuitry, the first master delay line signal of the pair from among the received plurality of master delay line signals to the slave delay line; and
    outputting, with the selection circuitry, the second master delay line signal of the pair from among the received plurality of master delay line signals to the controller.

13. The method of claim 12, wherein the pair of master delay line signals comprises a prior pair, and wherein the method further comprises:
  selecting, with the controller, a next pair of master delay line signals from among the plurality of different pairs of master delay line signals, wherein one of the master delay line signals of the next pair is common with the prior pair; and
  in response to selecting the next pair:
    outputting, with the selection circuitry, one of the next pair of master delay line signals from among the received plurality of master delay line signals to the slave delay line; and
    outputting, with the selection circuitry, the other of the next pair of master delay line signals from among the received plurality of master delay line signals to the controller.

14. The method of claim 9, further comprising:
  after outputting the adjusted programming delay value to the bias generator, communicating an input signal through the slave delay line with slave delay cells of the slave delay line being biased by the output bias set at a level based on the adjusted programming delay value.

15. The method of claim 9, wherein an intended phase difference between the pair of master delay line signals is equal to a desired phase delay of the slave delay line.

16. A system comprising:
  a master-slave delay locked loop (DLL) circuit comprising:
    a master delay line;
    a slave delay line; and
    a bias generator configured to supply an output bias to the slave delay line to set a phase delay of the slave delay line; and
  tuning circuitry configured to:
    receive a pair of master delay line signals from different points of the master delay line;
    output a first master delay line signal of the pair to the slave delay line;
    receive a delayed first master delay line signal from the slave delay line;
    generate a programming delay value based on a phase difference between the delayed first master delay line signal and a second master delay line signal of the pair; and
    output the programming delay value to the bias generator, wherein the bias generator is configured to set a level of the output bias based on the programming delay value received from the tuning circuitry.

17. The system of claim 16, wherein the tuning circuitry comprises:
   selection circuitry configured to:
      receive a plurality of master delay line signals; and
      sequentially output a plurality of different pairs of master delay line signals derived from the received plurality of master delay line signals, wherein for each of the different pairs, one of the master delay line signals that is output is communicated through the slave delay line to generate a delayed one of the master delay line signals and the other of the master delay line signals that is output is not communicated through the slave delay line; and
   a controller configured to determine a plurality of phase differences, each being associated with one of the plurality of different pairs of master delay line signals, and wherein for each of the different pairs, the associated phase difference is between the delayed one of the master delay line signals communicated through the slave delay line and the other of the master delay line signals not communicated through the slave delay line.

18. The system of claim 17, wherein the controller is configured to generate the programming delay value based on an average of the plurality of phase differences.

19. The system of claim 16, wherein the different points at which the master delay line signals of the pair are generated are separated by a number of master delay cells of the master delay line that is equal to a number of slave delay cells in the slave delay line.

20. The system of claim 16, wherein the slave delay line comprises a first slave delay line, wherein the bias generator comprises a first bias generator, wherein the pair of master delay line signals comprises a first pair of master delay line signals, wherein the programming delay value based on the phase difference comprises a first programming delay value based on a first phase difference,
   wherein the system further comprises a second slave delay line, and
   wherein the tuning circuitry is further configured to:
      receive a second pair of master delay line signals from different points of the master delay line, the second pair comprising a third master delay line signal and a fourth master delay line signal;
      output the third master delay line signal of the second pair to the second slave delay line;
      receive a delayed third master delay line signal from the second slave delay line;
      generate a second programming delay value based on a second phase difference between the delayed third master delay line signal and the fourth master delay line signal of the second pair; and
      output the second delay line value to the second bias generator.

* * * * *